(12) United States Patent
Nakano

(10) Patent No.: US 9,779,958 B2
(45) Date of Patent: Oct. 3, 2017

(54) METHOD OF, AND APPARATUS FOR, FORMING HARD MASK

(71) Applicant: ULVAC, INC., Chigasaki-shi, Kanagawa (JP)

(72) Inventor: Katsuaki Nakano, Chigasaki (JP)

(73) Assignee: ULVAC, Inc., Chigasaki-shi (JP)

( * ) Notice: Subject to any disclaimer, the term of this patent is extended or adjusted under 35 U.S.C. 154(b) by 0 days.

(21) Appl. No.: 14/560,659

(22) Filed: Dec. 4, 2014

(65) Prior Publication Data

US 2015/0228496 A1 Aug. 13, 2015

(30) Foreign Application Priority Data

Feb. 13, 2014 (JP) .................. 2014-025899

(51) Int. Cl.
| | | |
|---|---|---|
| *H01L 21/44* | (2006.01) | |
| *H01L 21/308* | (2006.01) | |
| *C23C 14/06* | (2006.01) | |
| *C23C 14/58* | (2006.01) | |
| *H01L 21/311* | (2006.01) | |
| *H01L 21/3205* | (2006.01) | |
| *H01L 21/321* | (2006.01) | |

(52) U.S. Cl.
CPC ...... *H01L 21/3081* (2013.01); *C23C 14/0641* (2013.01); *C23C 14/584* (2013.01); *C23C 14/5806* (2013.01); *C23C 14/5826* (2013.01); *H01L 21/31144* (2013.01); *H01L 21/321* (2013.01); *H01L 21/32051* (2013.01)

(58) Field of Classification Search
CPC ............ H01L 21/0337; H01L 21/0335; H01L 21/0332; H01L 21/67103; H01L 21/02326
See application file for complete search history.

(56) References Cited

U.S. PATENT DOCUMENTS

| | | | |
|---|---|---|---|
| 5,175,126 A * | 12/1992 | Ho et al. .................. 438/643 |
| 5,895,266 A * | 4/1999 | Fu et al. .................. 438/648 |
| 6,350,685 B1 * | 2/2002 | Asahina et al. ............. 438/660 |
| 7,337,745 B1 * | 3/2008 | Komino et al. .......... 118/723 E |
| 2001/0001503 A1 * | 5/2001 | Guo et al. .................. 257/622 |
| 2005/0106857 A1 * | 5/2005 | Min .................. H01L 21/76856 438/637 |
| 2008/0003831 A1 * | 1/2008 | Yang ................. H01L 21/02068 438/702 |
| 2008/0081417 A1 | 4/2008 | Choi | |

FOREIGN PATENT DOCUMENTS

| | | |
|---|---|---|
| JP | 2008-091915 A | 4/2008 |
| JP | 2012-141440 A | 7/2012 |

* cited by examiner

*Primary Examiner* — Selim Ahmed
*Assistant Examiner* — Evan Clinton
(74) *Attorney, Agent, or Firm* — Westerman, Hattori, Daniels & Adrian, LLP

(57) ABSTRACT

A method of forming a hard mask includes depositing step for depositing a titanium nitride film on a surface of a to-be-processed object; adsorbing step for adsorbing oxygen-containing molecules onto a surface of the titanium nitride film; and heating step for heating the titanium nitride film to a predetermined temperature.

11 Claims, 2 Drawing Sheets

METHOD OF, AND APPARATUS FOR, FORMING HARD MASK

The present invention relates to a method of, and apparatus for, forming a hard mask which is constituted by a titanium nitride film.

BACKGROUND ART

In manufacturing processes, e.g., of semiconductor equipment, when an interlayer dielectric (or insulation) film as an object to be processed (hereinafter also referred to as a "to-be-processed object") is dry-etched in order to obtain a predetermined wiring pattern, a titanium nitride film is used as a hard mask which restricts the etching range. As this kind of hard mask, there is known one which is made up of a single layer of titanium nitride film (see, e.g., JP-A-2008-91915). The titanium nitride film for use as a hard mask requires etching resistance (etching durability) and, therefore, the film density shall preferably be high. On the other hand, if the film stress is high, at the time when the interlayer dielectric (insulation) film is subjected to dry etching, the etching shape changes as a whole or locally and, consequently, the wiring pattern will be deformed. Therefore, the film stress shall preferably be small to the extent possible.

It is normal practice to deposit the titanium nitride film that constitutes the above-described hard mask, by using a titanium-made target, considering the productivity and the like, by means of reactive sputtering in which nitrogen gas is introduced depending on necessity. In this case, when the sputtering conditions (electric power to be applied, amount of nitrogen gas to be introduced, speed of exhausting, and the like) are set so that the titanium nitride film has such a film density as will demonstrate (exert) etching resistance, the film stresses will become as high to the compressive side as about −1000 MPa. On the other hand, when the sputtering conditions (electric power to be applied, amount of nitrogen gas to be introduced, speed of exhausting, and the like) are set so that the film stress of the titanium nitride film becomes small so as to be above, e.g., −100 MPa and near 0 MPa, the film density enough to demonstrate etching resistance cannot be obtained. In other words, the titanium nitride film that has been deposited by reactive sputtering has a relationship in that, when the film stress of the titanium nitride film is reduced, the film density is also lowered substantially in proportion thereto. This is considered to be due to the physical properties of the titanium nitride film.

The inventor of this invention has proposed in Japanese Patent Application No. 2012-141440 that the hard mask be constituted by two layers of a lower-side titanium nitride layer (layer that lies on the lower side) which is relatively lower in film density and is also smaller in film stress, and an upper-side titanium nitride layer (layer that lies on the upper side) which is relatively higher in film density and is also larger in film stress. According to this arrangement, there can be obtained a titanium nitride film which has a film density enough to demonstrate etching resistance but which is smaller in film stress. However, there were problems, due to the two-layer structure, in that not only must the quality as the entire film be controlled, but also must the qualities of each of the films in the upper-side layer and the lower-side layer be controlled, thereby bringing about the troublesome control of qualities with resultant poor productivity.

The inventor then made further strenuous efforts and studies and has obtained the following finding. In other words, the finding is that, after having deposited a titanium nitride film of a single layer, oxygen-containing molecules are caused to get adsorbed onto the surface of the film, followed by raising in temperature of the titanium nitride film, the film stress can be made smaller to the tensile side while maintaining a high film density.

SUMMARY

Problems to be Solved by the Invention

In view of the above points, this invention has a problem of providing a method of forming a hard mask in which a single layer of titanium nitride film with a small film stress can be formed while having a film density demonstrating an etching resistance. This invention also has a problem of providing an apparatus for forming the hard mask.

Means of Solving the Problems

To solve the above-described problems, the method of forming a hard mask according to this invention comprises depositing step for depositing a titanium nitride film on a surface of a to-be-processed object; adsorbing step for adsorbing oxygen-containing molecules onto a surface of the titanium nitride film; and heating step for heating the titanium nitride film to a predetermined temperature. This invention shall be understood to include not only the case in which the depositing step and the heating step are separate steps but also the case in which the heating step is included in the depositing step such as in the case in which the titanium nitride film is heated to the predetermined temperature during the depositing step, or the case in which the heating step is included in the adsorbing step.

According to this arrangement, the to-be-processed object is, for example, a silicon wafer or an interlayer dielectric film. When a titanium nitride film having a high film density is deposited on the surface of the to-be-processed object by reactive sputtering, the interatomic distances among the titanium atoms and nitrogen atoms in the deposited titanium nitride film become shorter than appropriate distances. Film stress will thus become larger to the compressive side. In such a case, in order for the interatomic distances to become appropriate, the titanium nitride film tries to extend. The to-be-processed object tracks (or follows) the titanium nitride film that is going to be extended (or expanded), and the to-be-processed will accordingly be warped into a mountain shape. According to this invention, the oxygen-containing molecules are caused to get adhered to the surface of the deposited titanium nitride film, and also the titanium nitride film is heated to the predetermined temperature. As a result, while maintaining a high film density, the film stress can be made smaller to the tensile side. By dispersion of the oxygen atoms into the surface layer of the titanium nitride film, it is considered to have an effect in that the interatomic distances in the surface layer of the titanium nitride film become farther (or larger) than those in the state before dispersion of the oxygen atoms. Therefore, while maintaining a high film density that demonstrates etching resistance, a single layer of titanium nitride film that is small in film stress can be formed. The titanium nitride film thus obtained is suitable for uses as a hard mask and a barrier metal. Even if the time and pressure in the adsorbing step, and the time in the heating step are varied, it has been confirmed that the film stress reducing effect cannot be improved beyond a certain level. It is therefore considered to be only in the surface layer of the titanium nitride film that the oxygen atoms are dispersed as noted above.

Preferably in this invention the depositing step and the heating step comprise: disposing in position inside a processing chamber a titanium-made target and the to-be-processed object; thereafter introducing rare gas and nitrogen gas into the processing chamber that has been evacuated; applying electric power to the target so that a titanium nitride film is deposited by reactive sputtering on the surface of the to-be-processed object. And the adsorbing step comprises: after having deposited the titanium nitride film on the surface of the to-be-processed object, introducing oxygen-containing gas into the processing chamber such that oxygen-containing molecules get adsorbed onto the surface of the titanium nitride film. According to this arrangement, the depositing step inclusive of the heating step can be performed in succession within a single processing chamber together with the heating step. Therefore, titanium nitride films can be formed with good productivity.

In this invention, preferably the adsorbing step comprises forming a plasma atmosphere of the oxygen-containing gas and exposing the titanium nitride film to the plasma atmosphere, thereby performing also the heating step. According to this arrangement, since the heating step is included in the adsorbing step, the titanium nitride film can be formed with good workability. In this case, after the depositing step, a plasma atmosphere of oxygen-containing gas is formed in the processing chamber in which the depositing step has been performed, thereby performing therein the adsorbing step and the heating step. In this manner, within the same processing chamber the depositing step, the adsorbing step, and the heating step can be performed in succession, thereby improving the productivity still further. On the other hand, in case the processing chamber for performing therein the depositing step is not provided with plasma forming means, or in case this processing chamber shall not be exposed to the oxygen-containing plasma atmosphere, the depositing step and the adsorbing step can be performed, respectively, in different processing chambers that are isolated from each other.

In this invention, preferably the heating temperature in the heating step is set to a range of 100 to 550° C. If the heating temperature is below 100° C., there is a problem in that the film stress cannot effectively be made smaller. On the other hand, if the heating temperature exceeds 550° C., the quality of the material constituting the to-be-processed object (device) will be deteriorated. It is to be noted, however, that the above-described range may be departed from if the titanium nitride film is exposed to the plasma atmosphere, A hard mask forming apparatus suitable for performing the above-described method of forming a hard mask preferably comprises: a vacuum processing chamber for performing therein the depositing step, the adsorbing step, and the heating step; an oxygen-containing gas introducing means for introducing oxygen-containing gas into the vacuum processing chamber; and a heating means for heating the to-be-processed object disposed in the vacuum processing chamber.

MODES FOR CARRYING OUT THE INVENTION

With reference to the drawings, explanation will now be made of a method of, and an apparatus for, forming a titanium nitride film with reference to an example in which the to-be-processed object is silicon wafer (hereinafter referred to as a "substrate W") and a single-layer of titanium nitride film F is formed as a hard mask on the substrate W. In each of the drawings, the constituting elements common to each other are affixed with the same reference marks so that duplicate explanation can be omitted.

Figure 1:
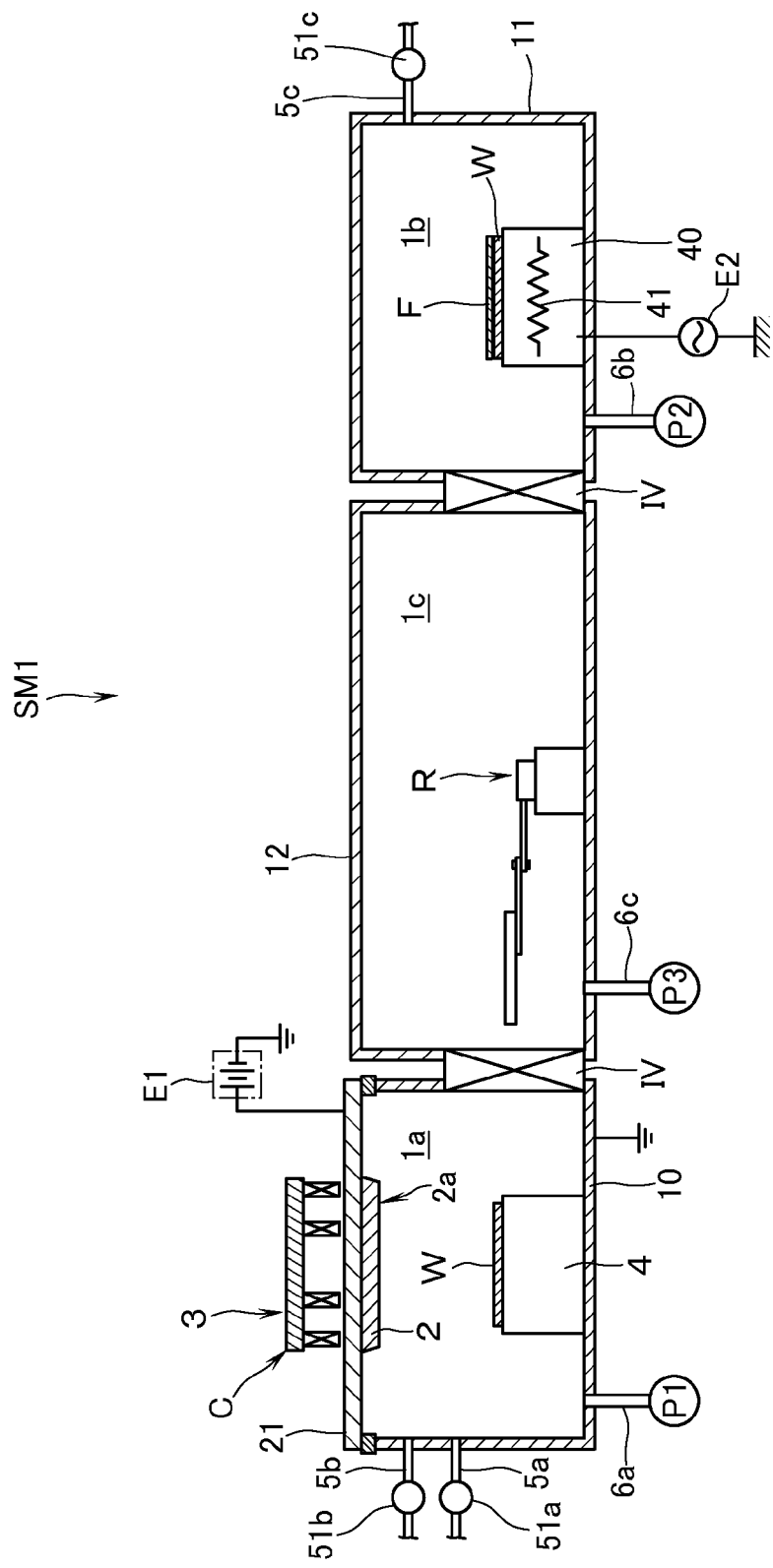
FIG. 1 is a schematic sectional view of an apparatus for forming a hard mask according to a first embodiment of this invention.

FIG. 1 shows an example of a sputtering apparatus SM1 as an apparatus for forming a hard mask according to a first embodiment of this invention. The sputtering apparatus SM1, which is of a magnetron system, has: a vacuum chamber 10 which defines a first vacuum processing chamber 1a; a vacuum chamber 11 which defines a second vacuum processing chamber 1b; and a transfer chamber 12 which defines a transfer chamber 1c interposed between the first vacuum chamber 10 and the second vacuum chamber 11. The transfer chamber 1c has disposed therein a transfer robot R so that the substrate W can be transferred between the vacuum chambers 10, 11. As the transfer robot R there can be used one having a known structure such, for example, as a frog-leg type. Therefore, detailed explanation thereof will be omitted here. The bottom portion of the transfer chamber 12 has connected thereto an exhaust pipe 6c which is in communication with a vacuum exhaust means P3 which is made up of a rotary pump and the like. The vacuum chambers 10, 11 and the transfer chamber 12 are partitioned by respective partition valves IV (isolation valves) so that the atmosphere can be isolated from each other.

The ceiling portion of the vacuum chamber 10 has mounted thereon a cathode unit C. In the following explanations definition is made such that the direction looking toward the ceiling portion of the vacuum chamber 10 in FIG. 1 is defined as "upper" and the direction looking toward the bottom thereof is defined as "lower." The cathode unit C is made up of a target 2, and a magnet unit 3 which is disposed above the target 2. The target 2 is made of titanium (e.g., titanium and commercially unavoidable amount of elements; so-called "consisting essentially of titanium") and is formed by a known method into a circle as seen in plan view (i.e., from top) depending on the outline of the substrate W. The upper surface of the target 2 (i.e., the surface opposite to the sputtering surface 2a) has mounted thereon a backing plate 21 which cools the target 2 during film deposition by sputtering. The backing plate 21 is attached to the vacuum chamber 1 through an electrically insulating material (not illustrated) with the sputtering surface 2a looking downward. The target 2 has connected thereto an output from a sputtering power source E1 such as DC power source and the like. It is thus so arranged that, during film deposition, DC electric power (30 kW or less) having a negative potential is applied to the target 2. The magnet unit 3 to be disposed above the target 2 has a known structure in which: a magnetic field is generated in a space below the sputtering surface 2a; electrons and the like that have been ionized in a space below the sputtering surface 2a at the time of sputtering are collected; and the sputtered particles scattered from the target 2 are efficiently ionized. Therefore, detailed explanation thereof will be omitted.

At the bottom portion of the vacuum chamber 10 there is disposed a stage 4 in a manner to lie opposite to the sputtering surface 2a of the target 2 so that the substrate W can be positioned and held with the film depositing surface thereof lying upward. In this case, the distance between the target 2 and the substrate W is set to be in a range of 45 to 100 mm taking into consideration the productivity, number of scattering, and the like. The side wall of the vacuum chamber 10 has connected thereto a first gas pipe 5$a$ which introduces a sputtering gas of rare gas such as argon and the like, and a second gas pipe 5$b$ which introduces a reactive gas such as nitrogen. The first and the second gas pipes 5$a$, 5$b$ have respectively interposed therein a mass flow controller 51$a$, 51$b$ which is connected to a respective gas source (not illustrated). According to this arrangement, the sputtering gas and the reactive gas whose flow rates are controlled can be introduced into the first vacuum processing chamber 1$a$ which is evacuated at a constant evacuating speed by a vacuum exhaust means P1 which is described hereinafter. During film deposition, the pressure (total pressure) in the first vacuum processing chamber 1$a$ is arranged to be maintained substantially constant. The bottom portion of the vacuum chamber 10 has connected thereto an exhaust pipe 6$a$ which is in communication with the vacuum exhausting means P1 which is made up of a turbo molecular pump, a rotary pump, and the like.

A stage 40 is disposed at the bottom portion of the above-described vacuum chamber 11. It is thus so arranged that the substrate W can be positioned and held with the titanium nitride film lying on the upper side, the titanium nitride film having been deposited in the first vacuum processing chamber 1$a$. The stage 40 has integrated (built) thereinto a heater as a heating means 41. It is thus so arranged that, by applying electric power to the heater from a power source (not illustrated), the titanium nitride film F can be heated to a predetermined temperature. As the heating means 41, not only the heater but also a known appliance such as ultraviolet light lamp and the like can be used. Therefore, detailed explanations are omitted here.

At the bottom portion of the vacuum chamber 11, there is connected an exhaust pipe 6$b$ which is in communication with the vacuum exhaust means P2 made up of a turbo molecular pump, rotary pump, and the like. The side wall of the vacuum chamber 11 has connected thereto a gas pipe 5$c$ which introduces oxygen-containing gas. The gas pipe 5$c$ has interposed therein a mass flow controller 51$c$, and is in communication with a gas source (not illustrated). The gas pipe 5$c$ and the mass flow controller 51$c$ constitute "oxygen-containing gas introducing means" of this invention. According to this arrangement, the oxygen-containing gas whose flow rate is controlled can be introduced into the second vacuum processing chamber 1$b$ that has been evacuated by the vacuum exhaust means P2.

The stage 40 has connected thereto an output from the bias power source E2 of a high-frequency power source and the like. It is thus so arranged that oxygen-containing plasma can be formed in the second vacuum processing chamber 1$b$. By exposing the titanium nitride film F to the oxygen-containing plasma, oxygen-containing molecules can be adsorbed onto the surface of the titanium nitride film, and also the titanium nitride film can be heated.

Although not particularly illustrated, the sputtering apparatus SM1 has a known control means which is provided with a microcomputer, sequencer, and the like. It is thus so arranged that an overall control can be made of the operation of each of the power sources E1, E2, the operation of the mass flow controllers 51$a$, 51$b$, 51$c$, the operation of the vacuum exhaust means P1, P2, P3, and the like. A method of forming a hard mask by using the sputtering apparatus SM1 will now be explained in concrete hereinbelow.

First of all, a substrate W is set in position on the stage 4 inside the vacuum chamber 10 in which the titanium-made target 2 is mounted. Thereafter, the vacuum exhaust means P1 is operated to evacuate the first vacuum processing chamber 1$a$ to a predetermined vacuum degree (e.g., $10^{-5}$ Pa). Once the vacuum processing chamber 1$a$ has reached the predetermined pressure, the mass flow controllers 51$a$, 51$b$ are respectively controlled to introduce argon gas and nitrogen gas at respective flow rates. At this time the flow rates of argon gas and nitrogen gas are controlled so that the pressure (total pressure) in the vacuum processing chamber 1$a$ attains a pressure within a range of 0.01 to 30 Pa. The flow ratio between argon gas and nitrogen gas can be set within a range of 0:1 to 100:1. In combination therewith, DC electric power having a predetermined negative electric potential is applied from the sputtering power source E1 to the target 2 so as to form a plasma atmosphere inside the vacuum chamber 10. According to this arrangement, a titanium nitride film F is deposited by reactive sputtering on the surface of the substrate W (depositing step). In this case, the sputtering time is set such that the film thickness of the titanium nitride film F falls within a range, e.g., of 5 to 200 nm.

The titanium nitride film F deposited in a manner as described above has shorter interatomic distances between the titanium atoms or between nitrogen atoms than appropriate distances. Therefore, while the titanium nitride film F has a film density enough to demonstrate (or exert) etching resistance, the film stress becomes larger (e.g., −250 MPa) to the compressive side. In this case, the titanium nitride film F tries to expand such that the interatomic distances attain appropriate distances. The substrate W will follow this titanium nitride film F that is going to be expanded and, as a result, the to-be-processed object W will be warped into a shape of a mountain.

As a solution, in this embodiment, when the deposition of the titanium nitride film F has been finished, applying of electric power to the target 2 is stopped, and also the introduction of the rare gas and nitrogen gas is stopped. By using the transfer robot R the substrate W on which the titanium nitride film F has been deposited is transferred onto the stage 40 inside the vacuum chamber 11. Then, the vacuum exhaust means P2 is operated to evacuate the vacuum processing chamber 1$b$ to the vacuum degree at the time of processing (e.g., below $1 \times 10^{-5}$ Pa). When the vacuum processing chamber 1$b$ has reached the predetermined pressure, the mass flow controller 51$c$ is controlled to introduce the oxygen-containing gas at a predetermined flow rate. According to this operation, it is possible for the oxygen-containing molecules to get adsorbed onto the surface of the titanium nitride film F (adsorbing step). At this time, the flow rate of the oxygen-containing gas is controlled such that the pressure inside the vacuum processing chamber 1$b$ attains a range of 0.01 Pa to atmospheric pressure, preferably a range of 0.01 to 1000 Pa. As the oxygen-containing gas, there may be used one containing oxygen atoms, such as oxygen gas, $H_2O$ gas, dry air (CDA), atmospheric air, and the like. Together with this, electric power is applied to the heater 41 that is built into the stage 40 to thereby heat the titanium nitride film F to the predetermined temperature (heating step). The heating temperature at this time shall preferably be set to a range of 100 to 550° C. If the heating temperature is below 100° C., there is a problem in that the film stress cannot effectively be minimized. On the other hand, if the heating temperature exceeds 550° C., there is a possibility that the material making up the above-described device may be deteriorated in quality.

Figure 2:
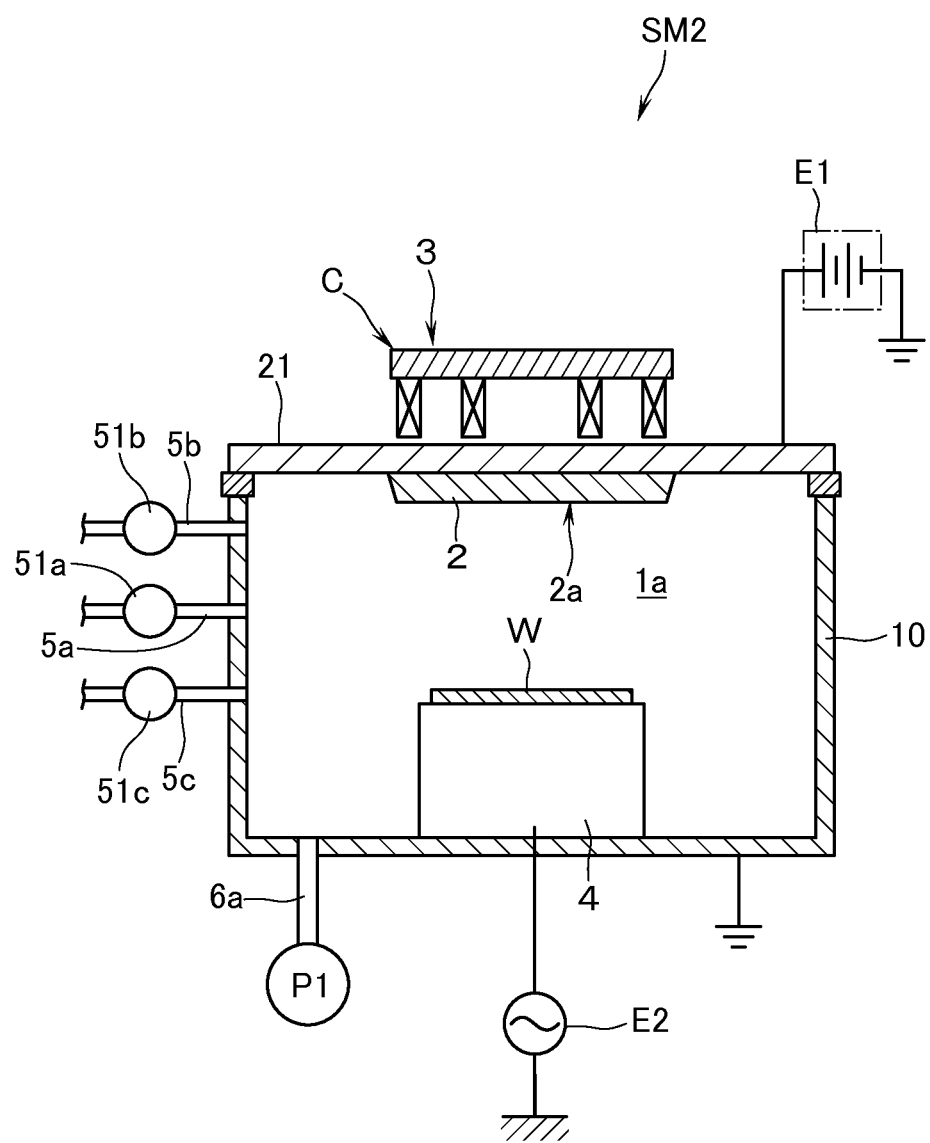
FIG. 2 is a schematic sectional view of an apparatus for forming a hard mask according to a second embodiment of this invention.

FIG. 2 shows an example of a sputtering apparatus SM2 as an apparatus for forming a hard mask according to a second embodiment of this invention. The sputtering apparatus SM2 is of a magnetron system and has a vacuum chamber 10 which defines a vacuum processing chamber 1a. An explanation will now be made of a case in which the depositing step, the adsorbing step, and the heating step are carried out in one and the same vacuum processing chamber 1a. The side wall of the vacuum chamber 10 has connected thereto a first gas pipe 5a for introducing rare gas, a second gas pipe 5b for introducing nitrogen gas and, in addition, a third gas pipe 5c for introducing oxygen-containing gas such as oxygen gas, $H_2O$ gas and the like to be used in the adsorbing step. The third gas pipe 5c has interposed therein a mass flow controller 51c. The gas pipe 5c and the mass flow controller 51c constitute "oxygen-containing gas introducing means" of this invention. The stage 4 has connected thereto an output from the bias power source E2 such as high-frequency power source and the like. It is thus so arranged that oxygen-containing plasma can be formed in the vacuum processing chamber 1a. By exposing the titanium nitride film F to the oxygen-containing plasma, the oxygen-containing molecules can be adsorbed onto the surface of the titanium nitride film F and also the titanium nitride film F can be heated. The bias power source E2 constitutes the "heating means" of this invention. By the way, the stage 4 has, in a similar manner as in the above-described stage 40, built therein a heater as a heating means (not illustrated). It is thus so arranged that, even if plasma is not formed, the titanium nitride film F can be heated to the predetermined temperature by applying electric power to the heater. An explanation will now be made in concrete of the method of forming a hard mask by using the above-described sputtering apparatus SM2.

First, in a similar manner as in the above-described embodiment, a depositing step is carried out to thereby deposit a titanium nitride film F on the surface of the substrate W. When the film deposition of the titanium nitride film F has been finished, applying of electric power to the target 2 is stopped and introduction of rare gas and nitrogen gas is stopped. Thereafter, the oxygen-containing gas is introduced at a predetermined flow rate. Also electric power is applied to the stage 4 to form an oxygen-containing plasma inside the vacuum processing chamber 1a. By exposing the titanium nitride film F to the oxygen-containing plasma, the adsorbing step and the heating step are performed. In a similar manner as in the above-described embodiment, the following may alternatively be carried out, i.e., after carrying out the adsorbing step without applying bias electric power to the stage 4 at the time of introducing the oxygen-containing gas, the titanium nitride film F is heated by applying electric power to the heater that is built into the stage 4, thereby carrying out the heating step.

Although not particularly illustrated in the above-described embodiment, after having carried out the depositing step, the adsorbing step, and the heating step as described above, the titanium nitride film is locally etched for patterning depending on the range to be restricted. Since known lithography step and the like can be utilized for the patterning, detailed explanation is omitted here.

As explained hereinabove, the titanium nitride film F that has been deposited in the depositing step so as to have a higher film density has a feature in that the interatomic distances in the film are shorter than appropriate distances, and that the titanium nitride film F has higher compressive stresses. In this embodiment, by carrying out the adsorbing step and the heating step, the oxygen atoms are dispersed into the surface layer of the titanium nitride film F. As a result, the interatomic distances among the titanium atoms and nitrogen atoms in the surface layer of the titanium nitride film F can be expanded. Therefore, it is possible, while maintaining a high film density of the titanium nitride film F, to effectively minimize the film stresses to the tensile side. In other words, while having a high film density that demonstrates etching resistance, a single-layer titanium nitride film F that is suitable for a hard mask can be formed. In this case, since only the quality of a single-layer titanium nitride film need be controlled, there is an effect in that the control becomes simpler.

Explanations have so far been made of the embodiments of this invention. This invention, however, shall not be limited to the above. In the above-described embodiments, the adsorbing step is carried out by introducing the oxygen-containing gas into the vacuum processing chamber. Alternatively, the adsorbing step may be carried out by once transferring into the atmosphere the substrate W on which the titanium nitride film F has been deposited in the vacuum processing chamber 1a. Thereafter, the substrate W may be transferred into the vacuum processing chamber 1b, and the heating step is carried out by heating the titanium nitride film F by means of the heating means 41. It is to be noted, however, that the adsorbing step can be carried out in vacuum without exposing the substrate W to the atmosphere more effectively to reduce the film stresses. In addition, as compared with the case in which the substrate W is exposed to the atmosphere, the time required for transferring, evacuation, and the like can be shortened, with the resultant improvement in productivity.

Further, in the above-described embodiments, explanations were made of the case in which the titanium nitride film F is deposited by reactive sputtering method. The method of depositing the film is, however, not limited to the above, but may use other film deposition methods such as vapor deposition method, CVD method, and the like. These alternative methods are effective in case the film stresses of the titanium nitride film after film deposition become high. Still furthermore, in the above-described embodiments, explanations have been made of examples in which silicon wafer was used as the to-be-processed object. This invention, however, is also applicable to the case, e.g., in which a titanium nitride film is formed on the surfaces of interlayer dielectric films.

In addition, after the depositing step, as a step auxiliary to the heating step, a step may be carried out in which the titanium nitride film is exposed to argon plasma. In this case, the flow rate of argon gas is controlled so that the vacuum processing chamber 1a attains a pressure in the range of 0.01 to 1000 Pa, and bias electric power of 50 to 3000 W is applied to the stage. According to this arrangement, the titanium nitride film can be effectively heated. Therefore, even if the temperature of heating the substrate by the heater 41 of the stage may be outside the above-described range of 100 to 550° C., the film stresses can be efficiently varied.

Next, in order to confirm the above-described effects, the following experiments have been carried out by using the above-described sputtering apparatus SM1, SM2. In these experiments, silicon wafer was used as the substrate W. A titanium nitride film F was deposited on the surface of the substrate W in the first vacuum processing chamber 1a by means of a reactive sputtering method. The film depositing conditions in this case are as follows. As a target 2, there was used one made of titanium, the distance between the target 2 and the substrate W was set to 60 mm, and the flow rate of argon gas was set to 90 sccm. The flow rate of nitrogen gas was set to 30 sccm (the pressure inside the vacuum processing chamber 1a at this time was set to be about 0.4 Pa). The electric power to be applied to the target 2 was set to 7 kW, and the deposition time was set to 33 seconds, so that a titanium nitride film F of film thickness of about 30 nm was deposited. The film density and the film stress of the deposited titanium nitride film F were found, upon measurement, to be both high values of 4.92 g/cm$^3$ in film density and −256.1 MPa (compressive stress) in film stress. As illustrated in Table 1, the measured values of the film density and the film stress were used as reference values (initial values).

After the titanium nitride film F was deposited under the above-described conditions, the substrate W was transferred to the second vacuum processing chamber 1b. While heating the titanium nitride film F to 360° C. by the heater 41, oxygen gas was introduced into the vacuum processing chamber 1b and kept the pressure at 400 Pa for 60 seconds. The resultant titanium nitride film thus obtained was defined as the invention product 1. By measuring the film density and the film stress of the invention product 1, it has been confirmed, as illustrated in Table 1, that the film stress was able to be effectively reduced to −72.0 MPa while maintaining the film density. Further, the titanium nitride films that have been obtained in a similar method as that of the invention product 1, except for the changes in the pressure in the vacuum processing chamber 1b to 4 Pa and 40 Pa, respectively, were defined to be the invention product 2 and the invention product 3, respectively. The titanium nitride films that have been obtained in a similar method as that of the invention product 1, except for the changes in the heating time to 5 seconds and 20 seconds, respectively, are defined to be the invention product 4 and the invention product 5. By measuring the film density and the film stress relating to these invention products 2 to 5, it has also been confirmed that, while maintaining the film density at a high value, the film stress was able to be reduced. Although not illustrated in Table 1, it has been confirmed that similar results were obtainable when the pressure inside the vacuum processing chamber 1b was changed to 1000 Pa.

After having deposited the titanium nitride film F, the titanium nitride film F was cooled to about 25° C. while supplying the vacuum processing chamber 1a with argon gas. Thereafter, the substrate W was transferred to the second vacuum processing chamber 1b and, while heating the titanium nitride film F at 360° C. by the heater 41, oxygen gas was introduced so as to keep the pressure at 400 Pa for 60 seconds. The titanium nitride film thus obtained was defined as the invention product 6. Except for the point in that the time for introducing the oxygen gas (time for maintaining the pressure) was changed to 180 seconds and a point in that the pressure at the point of introducing oxygen gas was changed to 1000 Pa, the titanium oxide films that were obtained in a similar method as that in the invention product 6 were defined as the invention product 7 and the invention product 8, respectively, As regards these invention products 6 to 8, it has been confirmed that, while the film density was kept high, the film stress could be reduced, though larger than those of the invention products 1 to 5. Judging from the fact that, even changing the time and pressure of adsorbing step (note: in the Table 1, also written as "adsorption/adsorption step"), and the time of heating step, the film stress was not reduced to the tensile side below −50 MPa as was the case with the invention products 1 to 8, it is considered to be only in the surface layer of the titanium nitride film that the oxygen atoms were dispersed.

In these experiments, while the heating temperature was made to be 360° C., it has been confirmed that there was an effect of reducing the film stress, though there was a range in which the film stress was reduced when the temperature was varied within a range of 100-550° C.

On the other hand, the titanium nitride film obtained in a similar manner as the one for the invention product 6, except for the fact that oxygen gas was not introduced, i.e., that the adsorbing step was not performed, was defined as a comparison product 1. Although the film stress of the comparison product 1 was reduced, it has been confirmed that the film stress was not reduced in an effective manner. As regards the comparison product 2 in which the gas at the time of cooling was changed to nitrogen gas, it has been confirmed that similar results were obtained. Further, the titanium nitride film that was obtained in a similar manner as that of the invention product 6, except for the fact that heating was not carried out after introduction of oxygen gas, i.e., that the heating step was not carried out, was defined as comparison product 3. It has been confirmed that the film stress of the comparison product 3 did not change. Judging from these results, it has been found out that, by carrying out both the adsorbing step and the heating step, the film stress was able to be effectively reduced. Further, from the results of the invention product 6 and the comparison product 3, the following has been found out. In other words, in case the adsorbing step was carried out through once cooling after the film deposition, even if heating was done at the time of film deposition, the film stress dis not vary effectively as long as the heating step was not performed thereafter.

In addition, after the titanium nitride film F has been deposited, the titanium nitride film F was cooled and taken out into the atmosphere only for 30 seconds, and thereafter the substrate W was once again transferred to the second vacuum processing chamber 1b. Then the titanium nitride film F was heated in the vacuum processing chamber 1b to 360° C. for 60 seconds by using the heater 41. The titanium nitride film thus obtained was defined as the invention product 9. The titanium nitride film F obtained in a similar manner as that of the invention product 9, except for the fact that the product was taken out into the atmosphere and was left as it is for the whole day, was defined as the invention product 10. Like these invention products 9 and 10 that were obtained by carrying out the adsorbing step by exposing the titanium nitride film to the atmosphere, it has been confirmed that the film stress was able to be reduced.

In addition, after the titanium nitride film F has been deposited, oxygen gas was introduced into the vacuum processing chamber 1a to control the pressure therein to 40 Pa. Further, the titanium nitride film that was heated to 360° C. for 20 seconds by a heater (not illustrated) built into the stage 4. The product thus obtained was defined as the invention product 11. A titanium nitride film obtained by a similar method as that for the invention product 11 except for the fact that the heating time was changed to 5 seconds, was defined as the invention product 12. It has been confirmed that in these invention products 11 and 12 the film stress could further be reduced.

Further, after the titanium nitride film F has been deposited in the first vacuum processing chamber 1a, the substrate W was transferred to the second vacuum processing chamber 1b. Oxygen gas was introduced into the vacuum processing chamber 1b and also bias electric power of 180 W was applied to the stage 40 to generate oxygen-containing plasma. The titanium nitride film that was obtained by exposing the titanium nitride film F to thus generated oxygen-containing plasma for 15 seconds, was defined as the invention product 13. Even in case the titanium nitride film was subjected to adsorbing step and heating step by exposing the titanium nitride film to oxygen plasma, it has been confirmed that the film stress was able to be still effectively reduced. Although not particularly illustrated, regarding the titanium nitride film that was obtained by a similar method as that for the invention product 13 except for the fact that the depositing step, the adsorbing step and the heating step were carried out in the single vacuum processing chamber 1a as illustrated in FIG. 2, it has been confirmed that the film stress was able to be effectively reduced.

Still furthermore, after having deposited a titanium nitride film F in the vacuum processing chamber 1a, argon gas was introduced into the vacuum processing chamber 1a in order to make the pressure therein to 2.0 Pa. Bias electric power of 270 W was applied to the stage 4 to thereby generate argon plasma. The titanium nitride film was then exposed to thus generated argon plasma (auxiliary heating). Thereafter in a similar manner as that for the invention product 11, oxygen gas was introduced to control the pressure therein to 40 Pa, and the titanium nitride film was also heated to 360° C. for 20 seconds by a heater (not illustrated) built into the stage 4. The titanium nitride film thus obtained was defined to be the invention product 14. It has been confirmed also with the invention product 14 that the film stress was effectively reduced.

As illustrated in the rightest column of Table 1, the specific resistivity of an initial (titanium nitride film after deposition) was 168 μΩcm, and the specific resistivity of the invention product 11, that was one of the most effective in film stress reducing effect, was 184 μΩcm. From the above fact, it has been confirmed that the variation in specific resistivity due to oxygen dispersion was about 10%. Therefore, it has been found that this invention is a method of greater general versatility that is applicable to a titanium nitride film which is expected to reduce, by a slight rise in electrical resistance, the compressive stress of the titanium nitride film. In other words, this invention can be applied, not only to the titanium nitride film for use as a hard mask, but also to other cases in which titanium nitride films for other uses are deposited.

EXPLANATION OF MARKS

| | |
|---|---|
| W | substrate (to-be-processed object) |
| E2 | bias power source (heating means) |
| F | silicon nitride film |
| 1a | first vacuum processing chamber |
| 1b | second vacuum processing chamber |
| R | transfer robot (transfer means) |
| 5c | gas pipe (oxygen-containing gas introducing means) |
| 51c | mass flow controller (oxygen-containing gas introducing means) |
| 41 | heater (heating means) |

TABLE 1

| | CONDITIONS | FILM DENSITY [g/cm$^{-3}$] | STRESS [MPa] | SPECIFIC RESISTANCE [μΩcm] |
|---|---|---|---|---|
| INITIAL | FILM DEPOSITION(Ar: 90 sccm, N$_2$: 30 sccm, Pow: 7 kW) | 4.92 | −256.1 | 168.6 |
| INVENTION PRODUCT 1 | FILM DEPOSITION - ADSORPTION • HEATING (O$_2$, 400 Pa, 360° C., 60 sec) | 4.93 | −72.0 | 221.2 |
| INVENTION PRODUCT 2 | FILM DEPOSITION - ADSORPTION • HEATING (O$_2$, 4 Pa, 360° C., 60 sec) | 4.92 | −74.3 | 203.3 |
| INVENTION PRODUCT 3 | FILM DEPOSITION - ADSORPTION • HEATING (O$_2$, 40 Pa, 360° C., 60 sec) | 4.92 | −74.0 | 211.3 |
| INVENTION PRODUCT 4 | FILM DEPOSITION - ADSORPTION • HEATING (O$_2$, 400 Pa, 360° C., 5 sec) | 4.90 | −95.4 | 200.0 |
| INVENTION PRODUCT 5 | FILM DEPOSITION - ADSORPTION • HEATING (O$_2$, 400 Pa, 360° C., 20 sec) | 4.92 | −59.6 | 195.3 |
| INVENTION PRODUCT 6 | FILM DEPOSITION • COOLING (Ar) - ADSORPTION (O$_2$, 400 Pa, 60 sec) - HEATING (360° C., 60 sec) | 4.91 | 121.3 | 189.9 |
| INVENTION PRODUCT 7 | FILM DEPOSITION • COOLING (Ar) - ADSORPTION (O$_2$, 400 Pa, 180 sec) - HEATING (360° C., 60 sec) | 4.93 | −102.2 | 188.0 |
| INVENTION PRODUCT 8 | FILM DEPOSITION • COOLING (Ar) - ADSORPTION (O$_2$, 1000 Pa, 60 sec) - HEATING (360° C., 60 sec) | 4.93 | −107.5 | 185.5 |
| INVENTION PRODUCT 9 | FILM DEPOSITION • COOLING (Ar) - ADSORPTION (TAKEN OUT INTO ATMOSPHERE FOR 30 SEC) - HEATING (360° C., 60 sec) | 4.92 | −77.2 | 184.9 |
| INVENTION PRODUCT 10 | FILM DEPOSITION • COOLING (Ar) - ADSORPTION (TAKEN OUT INTO ATMOSPHERE FOR 1 DAY) - HEATING (360° C., 60 sec) | 4.93 | −13.1 | 185.6 |
| INVENTION PRODUCT 11 | FILM DEPOSITION IN THE SAME PROCESSING CHAMBER - ADSORPTION • HEATING (O$_2$, 40 Pa, 360° C., 20 sec) | 4.94 | 22.5 | 184.4 |
| INVENTION PRODUCT 12 | FILM DEPOSITION IN THE SAME PROCESSING CHAMBER - ADSORPTION • HEATING (O$_2$, 40 Pa, 360° C., 5 sec) | 4.95 | −18.3 | 182.1 |
| INVENTION PRODUCT 13 | FILM DEPOSITION - ADSORPTION • HEATING (O$_2$PLASMA, 40 Pa, 180 W, 15 sec) | 4.97 | 13.2 | 183.0 |
| INVENTION PRODUCT 14 | FILM DEPOSITION - Ar PLASMA(2.0 Pa, 270 W, 60 sec) - ADSORPTION • HEATING(O$_2$, 40 Pa, 360° C., 60 sec) | 4.90 | 125.5 | 168.8 |
| COMPARATIVE PRODUCT 1 | FILM DEPOSITION • COOLING (Ar) - HEATING (360° C., 60 sec) ✗NO ADSORPTION STEP | 4.92 | −191.2 | 166.4 |
| COMPARATIVE PRODUCT 2 | FILM DEPOSITION • COOLING (N$_2$) - HEATING (360° C., 60 sec) ✗NO ADSORPTION STEP | 4.92 | −189.9 | 164.3 |
| COMPARATIVE PRODUCT 3 | FILM DEPOSITION • COOLING (Ar) - ADSORPTION (O$_2$, 400 Pa, 60 sec) ✗NO HEATING STEP | 4.91 | −252.0 | 167.7 |

What is claimed is:

1. A method of forming a hard mask comprising:
depositing step for depositing a titanium nitride film to be the hard mask on a surface of a to-be-processed object; thereafter
adsorbing step for adsorbing oxygen-containing molecules onto a surface of the titanium nitride film at oxygen partial pressure of 0.01-1000 Pa; and
heating step for heating the titanium nitride film to a predetermined temperature following the adsorbing step,
wherein the adsorbing step and the heating step are sequentially carried out as independent steps in a specified order,
wherein, due to the adsorbing step and the heating step, a stress of the titanium nitride film is changed to a tensile side, and
an amount of change in the stress of the titanium nitride film in the tensile side is above 134.8 MPa.

2. The method according to claim 1,
wherein, in the depositing step, after disposing in position a target made of titanium and the object-to-be-processed inside a processing chamber, rare gas and nitrogen gas are introduced into the processing chamber that has been evacuated, and the target is charged with electricity to thereby deposit by reactive sputtering the titanium nitride film on the surface of the object-to-be-processed,
wherein, in the adsorption step, after having formed the titanium nitride film on the surface of the object-to-be-processed, oxygen-containing gas is introduced into the processing chamber to thereby cause the oxygen-containing molecules to be adsorbed onto the surface of the titanium nitride film, and
wherein, in the heating step, the object-to-be-processed that has been heated in the depositing step is continuously heated.

3. The method according to claim 1,
wherein, in the adsorbing step, a plasma atmosphere of the oxygen-containing gas is formed and, by exposing the titanium nitride film to the plasma atmosphere, the heating step is also performed, wherein the object-to-be-processed is heated to 100-550° C.

4. The method according to claim 1,
wherein the heating temperature in the heating step is set to a range of 100-550° C.

5. A hard mask forming apparatus for carrying out the method of forming a hard mask according to claim 1, the apparatus comprising:
a vacuum processing chamber for performing therein the depositing step, the adsorbing step, and the heating step;
an oxygen-containing gas introducing means for introducing oxygen-containing gas into the vacuum processing chamber; and
a heating means for heating the to-be-processed object disposed in the vacuum processing chamber.

6. The method according to claim 1, wherein, in the depositing step, the oxygen-containing molecules are adsorbed at oxygen partial pressure of 4-400 Pa.

7. The method according to claim 1,
wherein, in the adsorbing step, a plasma atmosphere of the oxygen-containing gas is formed, and the titanium nitride film is exposed to the plasma atmosphere.

8. The method according to claim 1,
wherein, in the heating step, after the depositing step the to-be-processed object is heated by exposure to argon plasma which is free from oxygen-containing molecules.

9. The method according to claim 1, wherein
an amount of change in a density of the titanium nitride film is less than 0.05 g/cm³.

10. A method of forming a hard mask comprising:
depositing step for depositing on a surface of a to-be-processed object a titanium nitride film having a compression stress; thereafter
adsorbing step for adsorbing oxygen-containing molecules onto a surface of the titanium nitride film by exposing the to-be-processed object to the atmosphere for 30 seconds or more; and
heating step for heating the titanium nitride film to a predetermined temperature following the adsorbing step to thereby reduce the compression stress of the titanium nitride film such that an amount of change in the stress of the titanium nitride film in a tensile side is above 134.8 MPa, wherein
the adsorbing step and the heating step are sequentially carried out as independent steps in a specified order.

11. The method according to claim 10, wherein
an amount of change in a density of the titanium nitride film is less than 0.05 g/cm³.

* * * * *